(12) United States Patent
Lee

(10) Patent No.: US 8,681,537 B2
(45) Date of Patent: Mar. 25, 2014

(54) NONVOLATILE MEMORY APPARATUS HAVING MAGNETORESISTIVE MEMORY ELEMENTS AND METHOD FOR DRIVING THE SAME

(75) Inventor: Sung Yeon Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 9 days.

(21) Appl. No.: 13/219,641

(22) Filed: Aug. 27, 2011

(65) Prior Publication Data

US 2012/0257445 A1 Oct. 11, 2012

(30) Foreign Application Priority Data

Apr. 7, 2011 (KR) .................. 10-2011-0032227

(51) Int. Cl.
*G11C 11/00* (2006.01)
(52) U.S. Cl.
USPC .......................................... 365/158; 365/148
(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 438/3; 977/933–935
See application file for complete search history.

(56) References Cited

U.S. PATENT DOCUMENTS

| | | | | |
|---|---|---|---|---|
| 7,577,021 B2* | 8/2009 | Guo et al. | ..................... | 365/158 |
| 7,755,933 B2* | 7/2010 | Guo et al. | ..................... | 365/158 |
| 7,760,544 B2* | 7/2010 | Guo et al. | ..................... | 365/158 |
| 7,764,539 B2* | 7/2010 | Guo et al. | ..................... | 365/158 |
| 7,894,238 B2* | 2/2011 | Shinozaki | ..................... | 365/148 |
| 2003/0198080 A1* | 10/2003 | Iwata | ..................... | 365/158 |
| 2009/0129143 A1* | 5/2009 | Guo et al. | ..................... | 365/158 |
| 2009/0296455 A1* | 12/2009 | Guo et al. | ..................... | 365/158 |
| 2009/0296456 A1* | 12/2009 | Guo et al. | ..................... | 365/158 |

FOREIGN PATENT DOCUMENTS

| | | |
|---|---|---|
| JP | 2004-241004 A | 8/2004 |
| KR | 1020070062435 A | 6/2007 |
| KR | 1020100097743 A | 9/2010 |
| KR | 1020100135315 A | 12/2010 |

* cited by examiner

*Primary Examiner* — Harry W Byrne
(74) *Attorney, Agent, or Firm* — William Park & Associates Patent Ltd.

(57) ABSTRACT

A semiconductor memory apparatus includes a source line, a first bit line disposed over the source line, a second bit line disposed under the source line, a first memory cell between the source line and the first bit line, and a second memory cell between the source line and the second bit line.

13 Claims, 5 Drawing Sheets

NONVOLATILE MEMORY APPARATUS HAVING MAGNETORESISTIVE MEMORY ELEMENTS AND METHOD FOR DRIVING THE SAME

CROSS-REFERENCES TO RELATED APPLICATION

The present application claims priority under 35 U.S.C. §119(a) to Korean application number 10-2011-0032227, filed on Apr. 7, 2011 in the Korean Intellectual Property Office, and which is incorporated herein by reference in its entirety.

BACKGROUND

1. Technical Field

The present invention relates to a semiconductor memory apparatus and a method for driving the same, and more particularly, to a nonvolatile memory apparatus having magnetoresistive memory elements that store magnetization states as information and a method for driving the same.

2. Related Art

As portable communication devices are widely used, high performance is desired for memory elements or logic elements included in the devices. For example, high integration, high speed, and low power consumption may be preferred.

Recently, a new nonvolatile memory using a magnetic substance, magnetic random access memory (MRAM) using a tunnel magneto resistance effect, has been commercialized. Research is being conducted for higher performance as described for MRAM. MRAM changes the free direction of a free layer of a memory cell by using a magnetic field generated by an electric current flowing between a bit line and a word line. MRAM requires a predetermined switching magnetic field to drive itself. Furthermore, MRAM requires the minimum area to secure the minimum switching magnetic field. When MRAM is highly integrated, a risk of disturbance increases.

Currently, research is being conducted on spin torque transfer MRAM (STTMRAM) that provides a spin-polarized electrical current to one side and changes the direction of a free layer through spin transfer of electrons. STTMRAM can change the polarity of the free layer through spin injection for each memory cell. Thus, since a required current is reduced as the cell size decreases, STTMRAM is advantageous for high integration.

Referring to FIG. 1, STTMRAM generally includes one transistor (not illustrated) and one magnetic tunnel junction (MTJ) M. Such STTMRAM requires a reference cell to read data. In FIG. 1, BL represents a bit line, and SL represents a source line.

Referring to FIG. 2, STTMRAM may include a reference cell array separately installed on one side of a single cell array that includes a plurality of single cells where each single cell comprises one transistor and one MTJ. The reference cell array is configured to provide a reference voltage. The single cell array includes a plurality of bit lines BL. The reference cell array may be configured to include a smaller number of reference cells (not illustrated) than the number of single cells in the single cell array. Therefore, the reference cell array may occupy a small area. However, since a reference voltage having a voltage of H-L/2 that is an average of high voltage (H) and low voltage (L) is provided from the reference cell array, a sensing margin is relatively small. In FIG. 2, BLR represents a reference voltage line.

FIG. 3 illustrates another cell array having a different form from the single cell array. Referring to FIG. 3, the cell array includes bit lines BL and bit line bars BLB which are alternately arranged. When any one cell of a bit line BL is selected, a corresponding cell of a bit line bar BLB having a complementary relation with the bit line BL is used as a reference cell. Such a structure is referred to as a twin cell structure.

In the twin cell structure, a difference between a voltage (for example, H) applied to the bit line and a voltage (for example, L) applied to the bit line bar during a data read operation becomes a sensing margin (H-L). Therefore, the twin cell structure has a sensing margin two times larger than that of the single cell array. However, since a reference line (reference cell) should be provided at every bit line, the area of the twin cell structure becomes two times larger than that of the single cell array.

SUMMARY

In one embodiment of the present invention, a semiconductor memory apparatus includes a source line, a first bit line disposed over the source line, a second bit line disposed under the source line, a first memory cell between the source line and the first bit line, and a second memory cell between the source line and the second bit line.

In another embodiment of the present invention, a semiconductor memory apparatus includes a source line, a mode selection unit configured to selectively provide a voltage to the source line according to a write or read mode, a cell switching element coupled to the source line, a first memory cell coupled between the cell switching element and a bit line, and a second memory cell coupled between the cell switching element and a bit line bar where the voltage of the bit line bar is complementary to the voltage of the bit line. The source line is between the first and second memory cells.

In another embodiment of the present invention, a method for driving a semiconductor memory apparatus includes charging a source line with a first voltage level, applying a second voltage level to a first bit line electrically coupled to a first memory cell positioned over the source line, wherein the second voltage level is complementary to the first voltage level, applying the first voltage level voltage to a second bit line electrically coupled to a second memory cell positioned under the source line, and using one memory cell selected from the first and second memory cells as a reference cell, and sensing data stored in the other memory cell.

In another embodiment of the present invention, a method for driving a semiconductor memory apparatus includes charging a source line with a first voltage level, applying the first voltage level or a second voltage level to a first bit line coupled to a first memory cell positioned over the source line, wherein the second voltage level is complementary to the first voltage level, applying a voltage level that is complementary to the voltage level of the first bit line to a second bit line coupled to a second memory cell positioned under the source line, and sensing values stored in the first and second memory cells from currents corresponding to the first and second memory cells.

BRIEF DESCRIPTION OF THE DRAWINGS

Features, aspects, and embodiments are described in conjunction with the attached drawings, in which.

DETAILED DESCRIPTION

Figure 1:
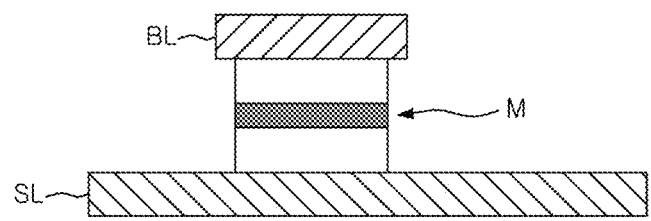
FIG. 1 is a schematic cross-sectional view of a conventional magnetoresistive memory element.
Figure 2:
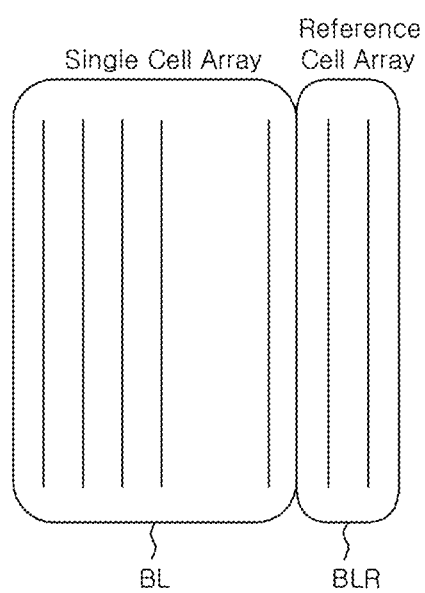
FIG. 2 is a schematic plan view of a conventional single cell array including a reference cell array.
Figure 3:
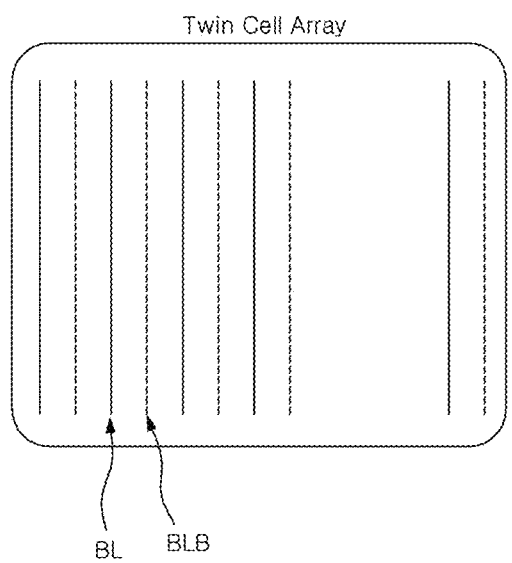
FIG. 3 is a schematic plan view of a conventional twin cell array.
Figure 4:
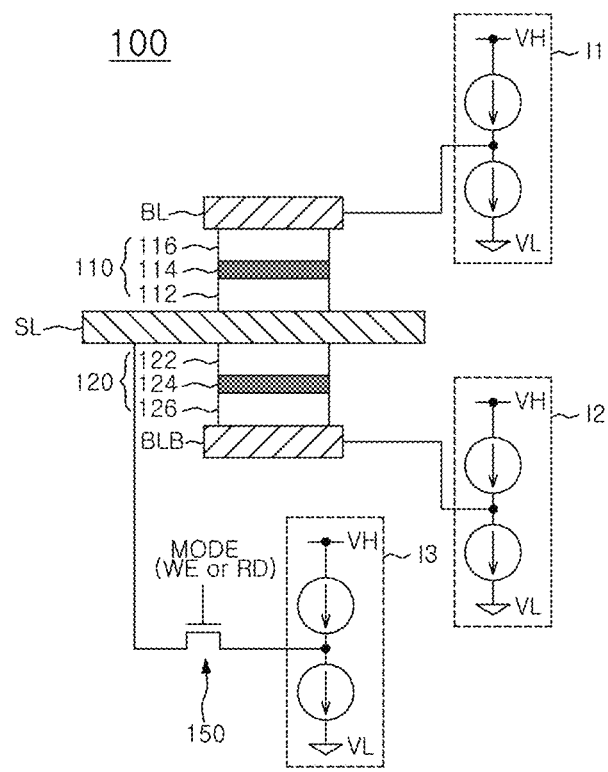
FIG. 4 is a schematic diagram of a semiconductor memory apparatus having magnetoresistive memory elements in a write mode according to an embodiment of the invention.
Figure 5:
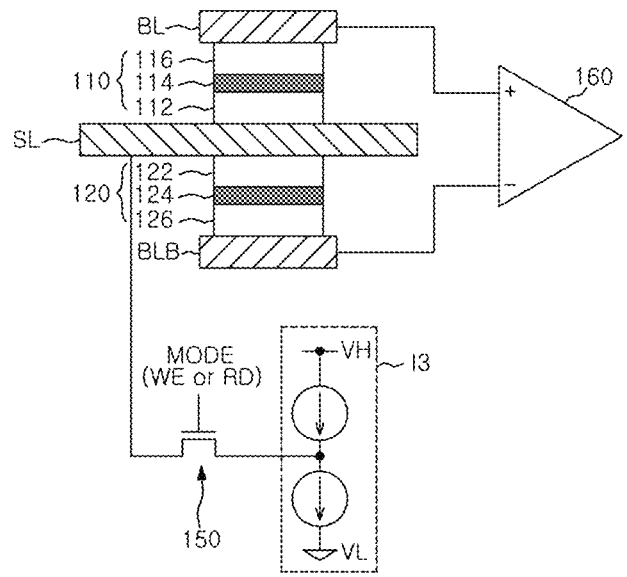
FIG. 5 is a schematic diagram of the semiconductor memory apparatus having magnetoresistive memory elements in a read mode according to an embodiment of the invention.

Hereinafter, a nonvolatile memory apparatus having magnetoresistive memory elements and a method for driving the same according to the present invention will be described below with reference to the accompanying drawings through exemplary embodiments. FIG. 4 is a diagram explaining a write operation of a semiconductor memory apparatus according to an embodiment of the invention. FIG. 5 is a diagram explaining a read operation of the semiconductor memory apparatus according to an embodiment of the invention.

Referring to FIG. 4, a semiconductor memory apparatus 100 according to an embodiment of the invention includes first and second memory cells 110 and 120 disposed symmetrically in a vertical direction, with a source line SL in between.

The first memory cell 110 is positioned between the source line SL and a first bit line BL, and may include a first fixed layer 112, a first information storage layer 114, and a first free layer 116, which are sequentially stacked over the source line SL.

The second memory cell 110 is positioned between the source line SL and a second bit line BLB, and may include a second fixed layer 122, a second information storage layer 124, and a second free layer 126, which are sequentially stacked under the source line SL. The first and second fixed layers 112 and 122 may be formed of a ferromagnetic material including Ni, Co, or Fe, such as, for example, NiFe, CoFe, NiFeB, CoFeB, NiGeSiB, or CoFeSiB. The first and second information storage layers 114 and 124 may be formed of MgO, for example. The first and second free layers 116 and 126 may be formed of a ferromagnetic material including Ni, Co, or Fe, such as, for example, NiFe, CoFe, NiFeB, CoFeB, NiGeSiB, or CoFeSiB.

The first bit line BL may be coupled to the first free layer 116, and the second bit line BLB may be coupled to the second free layer 126. Furthermore, the first bit line BL and the second bit line BLB are coupled to first and second current sources I1 and I2, respectively, so as to receive complementary voltage levels. The first and second current sources I1 and I2 are configured to selectively provide a high-level voltage VH or low-level voltage VL to the first and second bit lines BL and BLB. The high-level voltage VH may include a power supply voltage or internal voltage, and the low-level voltage VL may include a ground voltage.

The semiconductor memory apparatus 100 according to various embodiments may further include a switching element (not illustrated) between the source line SL and the first and second memory cells 110 and 120. The switching element will be described below in more detail with reference to FIG. 6.

A mode selection unit 150 may be, for example, a mode selection transistor driven in response to a mode signal MODE. Accordingly, the mode selection unit 150 will also be referred to as the mode selection transistor 150. The mode selection transistor 150 is coupled to a third current source 13 to provide a high-level voltage VH or low-level voltage VL to the source line SL in response to the mode signal MODE such as a write enable signal WE or read enable signal RD.

The first and second bit lines BL and BLB may maintain a complementary relationship. Also, a constant voltage may be provided to the source line SL. Therefore, data stored in the first and second memory cells 110 and 120 may also maintain a complementary relationship.

An operation of writing data in the information storage layer 114 or 124 will be described below.

The write enable signal WE is applied to the mode selection transistor 150 to provide a voltage of the third current source 13 to the source line SL. At this time, the source line SL may receive a high-level voltage VH.

The fixed layers 112 and 122 are magnetized in a first direction (→) and the free layers 116 and 126 are magnetized in a second direction (←) perpendicular to the first direction. The magnetization may be via an external magnetic field or electric field. Then, an electric current in one direction is applied from the fixed layers 112 and 122 or the free layers 116 and 126. When a spin-polarized electric current is applied from the fixed layer 112 and 122 by the high-level voltage VH from the third current source 13, the information storage layers 114 and 124 are magnetized in the first direction (→) corresponding to the magnetization direction of the fixed layers 112 and 122.

When a spin-magnetized electric current is applied from the first or second layer 116 or 126 by the first and second current sources I1 and I2 applying a selective high-level voltage VH to the corresponding free layers 116 and 126, an information storage layer selected from the first and second information storage layers 114 and 124 is magnetized in the same second direction (←) as the magnetization direction of the corresponding free layer 116 or 126.

Then, predetermined data are written into the information storage layers 114 and 124.

Figure 6:
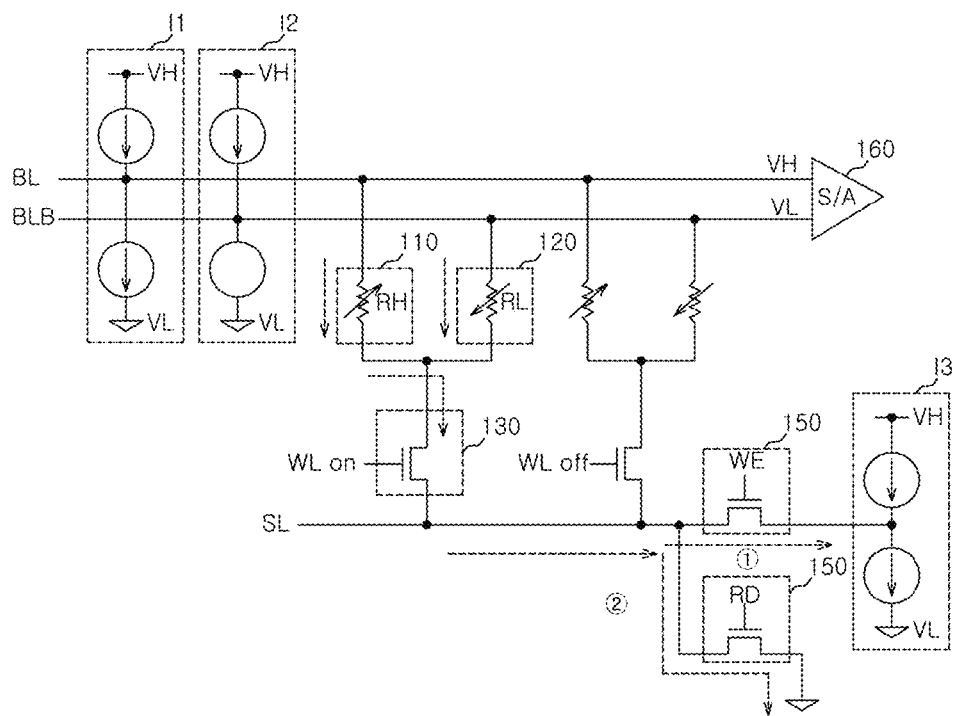
FIG. 6 is an equivalent circuit diagram of the semiconductor memory apparatus having magnetoresistive memory elements in the read mode according to an embodiment of the invention.

FIGS. 5 and 6 are diagrams explaining a read operation of the semiconductor memory apparatus according to an embodiment of the invention. FIG. 6 is an equivalent circuit diagram of the nonvolatile memory apparatus of FIG. 5.

Referring to FIGS. 5 and 6, a sense amplifier 160 is coupled between the first and second bit lines BL and BLB.

When a read enable signal RD is applied through a gate of the mode selection transistor 150, the third current source 13 provides a low-level voltage VL to the mode selection transistor 150.

A word line signal WL is applied to any one of cell switching elements 130 coupled between a connection node of the first and second memory cells (110 and 120, respectively) and the source line. For example, if the high-level voltage VH is applied to the first bit line BL and the low-level voltage VL is applied to the second bit line BLB, the first memory cell 110 has resistance in a high state, and the second memory cell 120 has resistance in a low state. The first memory cell 110 may serve as a reference cell of the second memory cell 120, and the second memory cell 120 may serve as a reference cell of the first memory cell 110.

Since the sense amplifier 160 is coupled to the first bit line BL receiving the high-level voltage VH and the second bit line BLB receiving the low-level voltage VL, the sense amplifier 160 considers the first and second memory cells as one unit memory cell, and senses data stored (written) in the unit memory cell as current values flowing in the first and second memory cells. Accordingly, the sensing margin of the sense amplifier 160 becomes VH-VL.

The first and second memory cells 110 and 120 according to an embodiment are formed in such a structure that they are stacked symmetrically in a vertical direction with the source line in between. Therefore, the first and second memory cells 110 and 120 substantially have an area corresponding to that of a single cell array. Furthermore, since the first and second bit lines receive individual voltages as described above, it is possible to secure a sensing margin corresponding to a voltage difference applied between the first and second bit lines.

The source line SL may be arranged in various ways as described below.

Figure 7:
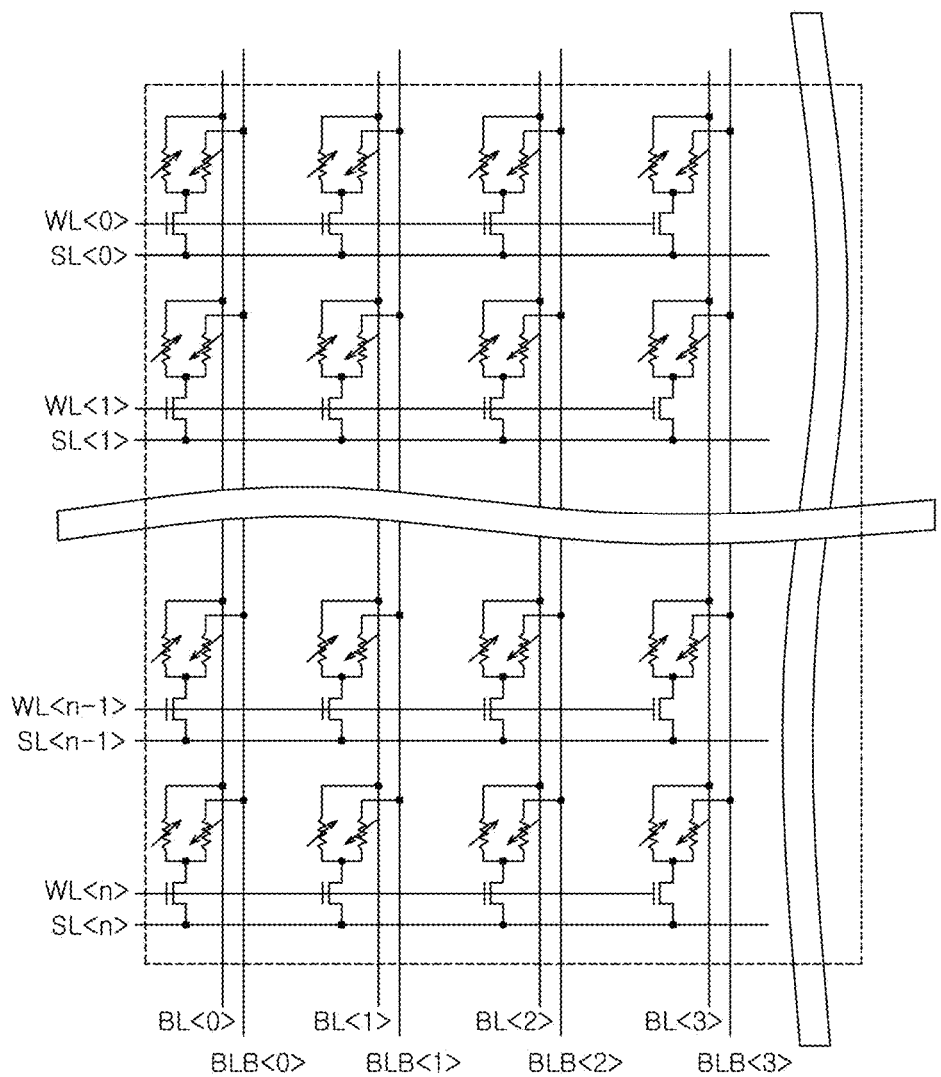
FIG. 7 is a circuit diagram illustrating the cell array structure of a semiconductor memory apparatus having horizontal source lines according to another embodiment of the invention.

Referring to FIG. 7, source lines SL<0:n> may be arranged in parallel to word lines WL<0:n> for transmitting a word line signal WL. Each of the source lines SL<0:n> and a corresponding one of the word lines WL<0:n> form pairs, and are arranged to cross bit line pairs BL<0:3>–BLB<0:3>, thereby to implement a memory cell array. A bit line pair BL<i>–BLB<i> is formed by each of the BL<0:3> and a corresponding one of the BLB<0:3>.

Figure 8:
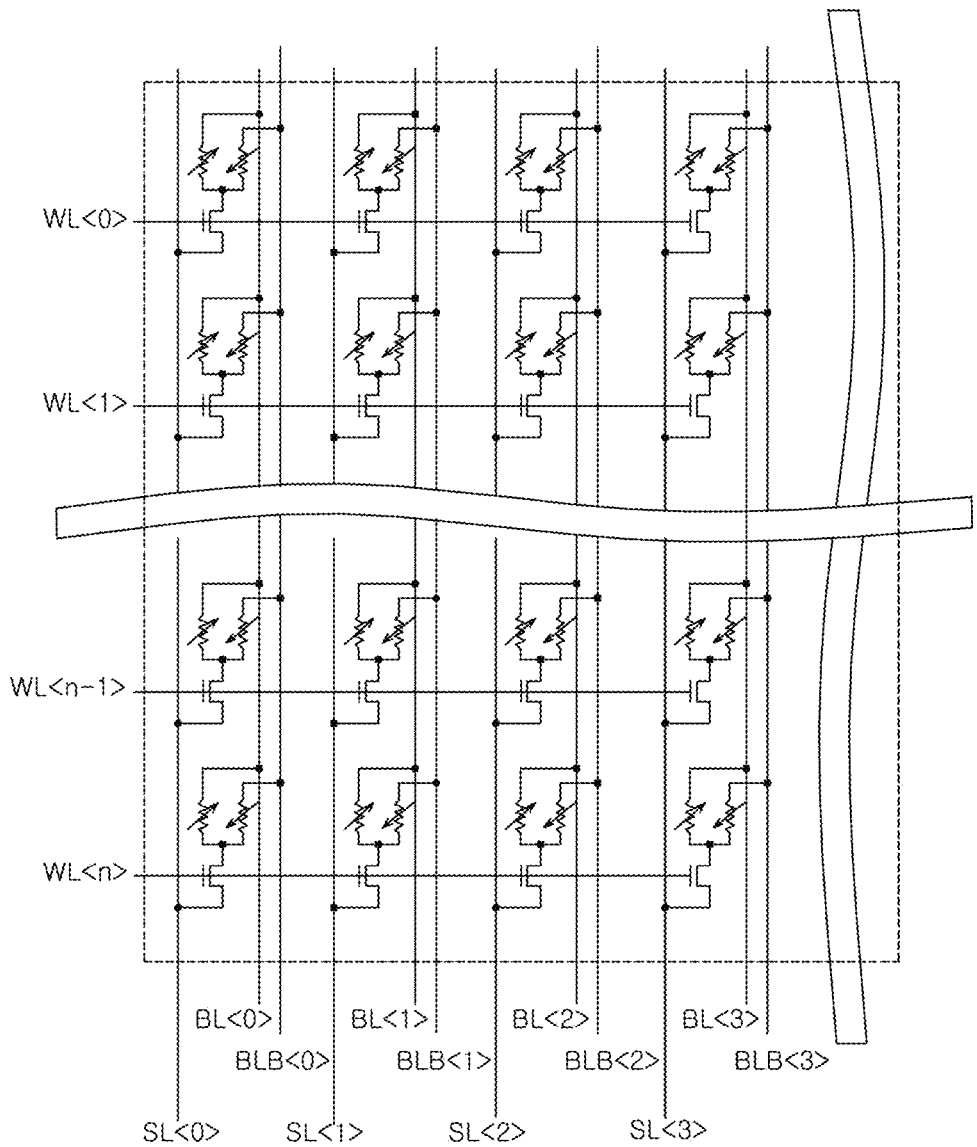
FIG. 8 is a circuit diagram illustrating the cell array structure of a semiconductor memory apparatus having vertical source lines according to another embodiment of the invention.

Referring to FIG. 8, the source lines SL<0:n> may be arranged in parallel to the bit line pairs BL<0:3>–BLB<0:3> formed from bit lines BL<0:3> and BLB<0:3>, and arranged perpendicular to the word lines WL<0:n>. In this case, the source lines SL<0:n> and the bit line pairs BL<0:3>–BLB<0:3> composing one memory cell may be disposed to be separated from each other by a space defining one memory cell.

According to the above-described embodiment, the unit memory cell of the semiconductor memory apparatus is formed by using the first memory cell coupled to the bit line and the second memory cell coupled to the bit line bar, and the first and second memory cells are stacked symmetrically in a vertical direction with the source line in between. Accordingly, since the first and second memory cells have a stacked structure, it is possible to reduce the area to the area of a single cell array, without the need for the reference cell array.

Furthermore, according to the currents corresponding to the first and second memory cells, the semiconductor memory apparatus may read a value of a corresponding memory cell. Since the voltage between the bit line and the bit line bar may be sensed to measure the currents of the first and second memory cells, the sensing margin is increased two or more times than when a reference cell is used.

Furthermore, the semiconductor memory cell apparatus has substantially has a twin cell array structure in an area of a single cell structure. When the first memory cell is read, the second memory cell serves as a reference cell, and when the second memory cell is read, the first memory cell serves as a reference cell. Therefore, it is possible to secure a high sensing margin and a sensing characteristic without increasing the area.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
a source line;
a first bit line disposed over the source line;
a second bit line disposed under the source line;
a first memory cell between the source line and the first bit line;
a second memory cell between the source line and the second bit line; and
a cell switching element coupled between a connection node of the first and second memory cells and the source line.

2. The semiconductor memory apparatus according to claim 1, wherein the first memory cell comprises a fixed layer and a free layer stacked on an upper surface of the source line.

3. The semiconductor memory apparatus according to claim 1, wherein the second memory cell comprises a fixed layer and a free layer stacked underneath a lower surface of the source line.

4. The semiconductor memory apparatus according to claim 1, wherein the cell switching element is configured to select the first and second memory cells.

5. The semiconductor memory apparatus according to claim 4, wherein the cell switching element comprises a MOS transistor configured to receive a word line signal.

6. The semiconductor memory apparatus according to claim 1, wherein the first and second bit lines are configured to receive voltage levels having a complementary relation with each other.

7. The semiconductor memory apparatus according to claim 6, wherein the first bit line is coupled to a first current source configured to selectively provide a high-level or low-level voltage and current.

8. The semiconductor memory apparatus according to claim 6, wherein the second bit line is coupled to a second current source configured to selectively provide a high-level or low-level voltage and current.

9. The semiconductor memory apparatus according to claim 1, further comprising a mode selection transistor coupled between the source line and a third current source, and configured to transmit a voltage and current between the third current source and the source line, according to a mode selection signal.

10. The semiconductor memory apparatus according to claim 9, wherein the mode selection signal comprises a write enable signal or read enable signal.

11. The semiconductor memory apparatus according to claim 1, further comprising a sense amplifier coupled between the first and second bit lines and configured to read values stored in the first and second memory cells.

12. The semiconductor memory apparatus according to claim 1 wherein the second memory cell is stacked vertically with the first memory cell.

13. The semiconductor memory apparatus according to claim 1 wherein the first memory cell and the second memory cell are disposed symmetrically in a vertical direction about the source line.

* * * * *